United States Patent
Kwean

[11] Patent Number: 6,150,281
[45] Date of Patent: Nov. 21, 2000

[54] METHOD FOR MANUFACTURING CONTACT HOLE USING AN ETCHING BARRIER LAYER PATTERN

[75] Inventor: Sung-un Kwean, Yongin, Rep. of Korea

[73] Assignee: Samsung Electronics, Co., Ltd., Suwon, Rep. of Korea

[21] Appl. No.: 09/313,452

[22] Filed: May 18, 1999

[30] Foreign Application Priority Data

May 18, 1998 [KR] Rep. of Korea ...................... 98-17864

[51] Int. Cl.$^7$ ................................................. H01L 21/302
[52] U.S. Cl. .......................... 438/724; 438/734; 257/774
[58] Field of Search ................................... 438/396, 672, 438/702, 706, 713, 723, 724, 734, 740; 257/758, 773, 774, 776

[56] References Cited

U.S. PATENT DOCUMENTS

| | | | |
|---|---|---|---|
| 5,539,231 | 7/1996 | Suganaga et al. ...................... | 257/306 |
| 5,627,095 | 5/1997 | Koh et al. ................................. | 438/672 |
| 5,726,499 | 3/1998 | Irinoda ..................................... | 257/774 |
| 5,763,323 | 6/1998 | Kim et al. ................................. | 438/637 |

*Primary Examiner*—Benjamin L. Utech
*Assistant Examiner*—Kin-Chan Chen
*Attorney, Agent, or Firm*—Marger Johnson & McCollom, P.C.

[57] ABSTRACT

A method for manufacturing contact holes in a semiconductor device is provided. In this method, a semiconductor substrate, having first and second conductive regions formed therein, is provided. A lower interdielectric layer is formed on the substrate. An etching barrier layer is formed on the lower interdielectric layer. The etching barrier layer is etched to form a plurality of holes for defining contact holes to be formed in different interdielectric layers. Then, a contact hole is formed in the lower interdielectric layer, using one of the holes in the etching barrier layer as an etching mask, and then a conductive layer pattern filling the contact hole is formed. Subsequently, an upper interdielectric layer and a mask pattern are sequentially formed on the conductive layer pattern. The upper interdielectric layer is etched, using the mask pattern as an etching mask, and then the lower interdielectric layer is etched, using the other hole in the etching barrier layer pattern as an etching mask, thereby completing a contact hole that passes through the upper and lower interdielectric layers. Thus, a plurality of contact holes of various heights can be formed with greater area tolerance and the process margin can be maximized.

14 Claims, 8 Drawing Sheets

METHOD FOR MANUFACTURING CONTACT HOLE USING AN ETCHING BARRIER LAYER PATTERN

BACKGROUND OF THE INVENTION

1. Field of the Invention

The present invention relates to a method for manufacturing a semiconductor device, and more particularly, to a method for manufacturing contact holes of a semiconductor device using an etching barrier layer pattern.

2. Description of the Related Art

As the integration level of a semiconductor device becomes higher, its contact holes become smaller. Thus, high resolution photolithography is required to form the small-sized contact holes, and a misalignment margin in the photolithography is also reduced.

Particularly, a contact hole exposing a conductive region between gates of transistors, e.g., a contact hole for a bit line, or a contact hole for a storage electrode which exposes a drain and source region, must be very small to prevent an adjacent gate from being exposed. Also, the contact hole for a bit line or the contact hole for a storage electrode must be formed through one or more thick interdielectric layers. For this reason, a photoresist pattern for forming the contact hole must be also thick. However, as the photoresist pattern becomes thicker, the resolution becomes lower, making it difficult to define a desired small contact hole.

Even a slight misalignment in the photolithography process can expose the gate of the transistor adjacent to the contact hole, greatly deteriorating the performance of the semiconductor device. Thus, in forming the contact hole for a bit line or storage electrode, an etching method is widely used in which the sidewall of the contact hole has a gradient of 85–86° with respect to a bottom surface of the contact hole, thereby increasing a misalignment margin.

However, in the above etching method, an etching selectivity of a silicide layer with respect to an interdielectric layer, e.g., an oxide layer, is very low. In order to reduce contact resistance and sheet resistance of a shallow junction region of the source/drain region, the silicide layer is formed on a source/drain region and a polysilicon gate using salicide (self-aligned silicide) technology. Thus, if the etching selectivity with respect to the silicide layer is low in forming the contact hole, the silicide on the source/drain region is damaged such that the sheet resistance increases.

Also, in a process of forming a semiconductor device by a 0.25 μm design rule, the bit line is formed using a damascene method. By the damascene method, after forming a damascene pattern for forming a bit line, a photoresist pattern for forming the contact hole for a bit line is formed on the interdielectric layer where the damascene pattern is formed thereon. Subsequently, the photoresist pattern is flowed to reduce the size of a window defined by the original photoresist pattern, and then the interdielectric layer is etched to form a contact hole for a bit line. If misalignment in the photolithography for forming the contact hole for a bit line occurs a phenomenon in which the photoresist pattern partially hangs over the summit of sidewalls of the damascene pattern. Thus, in a process of flowing the photoresist pattern to reduce the window size, the amount of flow of the photoresist pattern covering the edge portion of the damascene pattern is different from that on a flat portion in the negative pattern, preventing the bit line contact hole from being formed or lowering the is uniformity of the bit line contact hole, and lowering the reliability of the device.

SUMMARY OF THE INVENTION

It is therefore an objective of the present invention to provide a method for manufacturing small contact holes by a vertical etching method without damaging characteristics of a device.

According one embodiment of the present invention to achieve the above objective, a method for manufacturing contact holes, include the steps of: (a) providing a semiconductor substrate where first and second conductive regions are formed; (b) forming a lower interdielectric layer on the semiconductor substrate; (c) forming an etching barrier layer on the lower interdielectric layer; (d) forming a first hole and a second hole in the etching barrier layer, said first hole overlying the first conductive region, said second hole overlying the second conductive region; (e) etching the lower interdielectric layer, using the first hole as an etching mask, thereby forming a first contact hole exposing the first conductive region; (f) forming a conductive line overlying the etching barrier layer and filling the first contact hole; (g) forming an upper interdielectric layer on the conductive line; (h) forming a mask pattern on the upper interdielectric layer, said mask pattern defining a third contact hole overlying the second hole; and (i) etching the upper interdielectric layer, using the mask pattern as an etching mask, thereby forming the third contact hole, and etching the lower interdielectric layer, using the second hole as an etching mask, thereby forming a second contact hole exposing the second conductive region.

According to another embodiment of the present invention, the method for manufacturing contact holes includes the steps of: (a) providing a semiconductor substrate where first and second conductive regions are formed; (b) forming a lower interdielectric layer on the semiconductor substrate; (c) forming an etching barrier layer on the lower interdielectric layer; (d) forming a first hole and a second hole in the etching barrier layer, said first hole overlying the first conductive region, and said second hole overlying the second conductive region; (e) forming an intermediate interdielectric layer on the etching barrier layer; (f) forming a damascene pattern in the intermediate interdielectric layer for forming a conductive line; (g) etching the lower interdielectric layer, using the first hole in the etching barrier layer as an etching mask, thereby forming a first contact hole exposing the first conductive region; (h) forming a conductive line overlying the etching barrier layer and filling the first contact hole and the damascene pattern; (i) forming an upper interdielectric layer overlying the conductive line; (j) forming a mask pattern on the upper interdielectric layer, said mask pattern defining a third contact hole overlying the second hole in the etching barrier layer; and (k) etching the upper and intermediate interdielectric layers, using the mask pattern as an etching mask, thereby forming the third contact hole, and etching the lower interdielectric layer, using the second hole as an etching mask, thereby forming a second contact hole exposing the second conductive region.

Preferably, in the etching for forming the first, the second and the third contact holes, the etching ratio of the lower, intermediate and upper interdielectric layers to the first and second etching barrier layer patterns is 10:1 or more. Thus, the first and second etching barrier layer patterns are formed of a nitride layer, an insulating layer including a nitride, or an undoped polysilicon layer, and the first and second etching barrier layer patterns are formed to a thickness of 200–1000 Å. Preferably, the etching are performed using a gas mixture of $C_2F_6$ and $C_3F$, or a gas mixture of $C_4F_8$, an inert gas and oxygen.

It is also preferable that a silicide layer is formed in first and second conductive regions and a region adjacent to the first and the second conductive regions, before the step of forming the lower interdielectric layer.

According to the present invention, a plurality of small contact holes having various heights can be formed easily, and a process margin is maximized.

BRIEF DESCRIPTION OF THE DRAWINGS

The above objective and advantages of the present invention will become more apparent by describing in detail a preferred embodiment thereof with reference to the attached drawings in which:

FIGS. 7B, 8B, 9B, 103B, 11B and 12B are sectional views of the DRAM device of FIG. 1 taken along line B–B–, for illustrating a process of fabricating a contact hole according to another embodiment of the present invention.

DESCRIPTION OF THE PREFERRED EMBODIMENTS

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concepts of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 1:
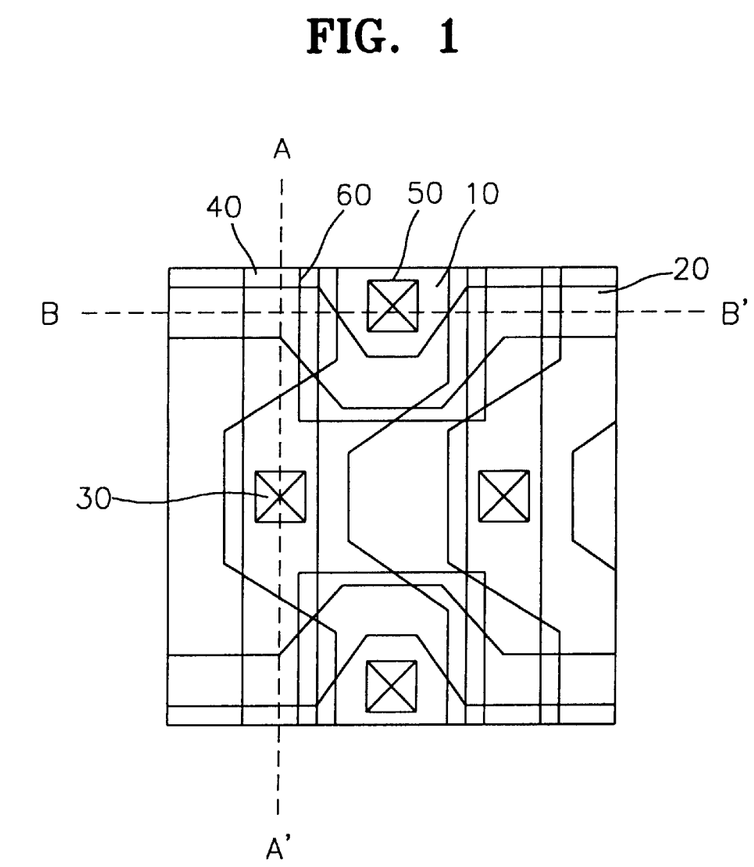
FIG. 1 is a layout of a DRAM device manufactured according to a method of the present invention.

Referring to FIG. 1, reference numeral 10 denotes an active region pattern, reference numeral 20 denotes a gate electrode pattern, reference numeral 30 denotes a contact hole pattern for a bit line, reference numeral 40 denotes a bit line pattern, reference numeral 50 denotes a contact hole pattern for a storage electrode, and reference numeral 60 denotes a storage electrode pattern.

A method for manufacturing a plurality of contact holes will be described according to a first embodiment of the present invention will be described with reference to FIGS. 2A through 6B which are sectional views of a DRAM device of FIG. 1 taken along lines A–A' and B–B', respectively.

Figure 2A:
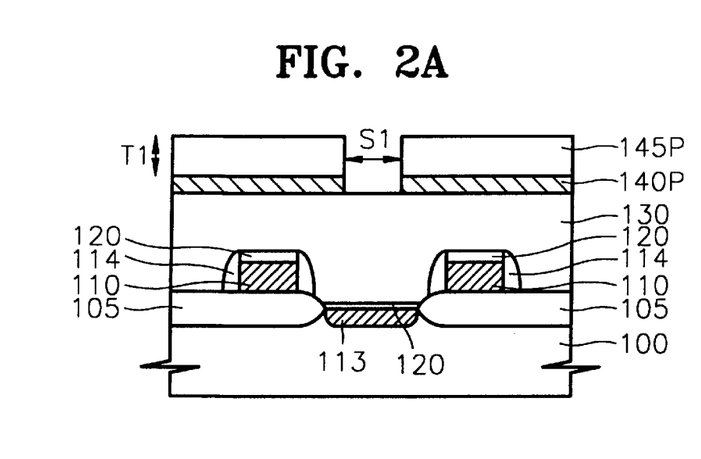
FIGS. 2A, 3A, 4A, 5A and 6A are sectional views of the DRAM device of FIG. 1 taken along line A–A', for illustrating a process of fabricating a contact hole according to an embodiment of the present invention.
Figure 2B:
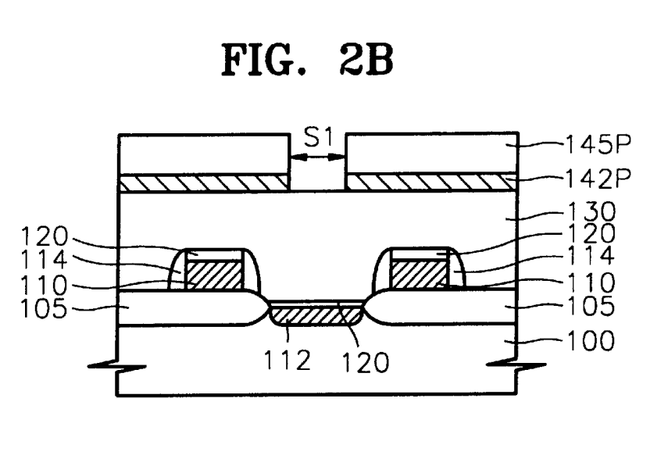
FIGS. 2B, 3B, 4B, 5B and 6B are sectional views of the DRAM device of FIG. 1 taken along line B–B', for illustrating a process of fabricating a contact hole according to an embodiment of the present invention.

Referring to FIGS. 2A and 2B, a field oxide layer 105 defining an active region is formed on a semiconductor substrate 100 using a LOCal Oxidation of Silicon (LOCOS) method. Then, a gate electrode pattern 110 of a transistor is formed on the field oxide layer 105. Subsequently, an impurity is implanted into the entire surface of the substrate to form a conductive region, for example, a source region 112 and a drain region 113. After forming an insulating spacer 114 on the sidewalls of the gate electrode pattern 110, a salicide process is performed. That is, a transition metal such as Ti, Ta, Co or Mo is stacked on the entire surface of the substrate 100 where the insulating spacer 114 is formed, and then the resultant structure is annealed. The transition metal reacts with the exposed polysilicon on the gate electrode pattern 110 and the exposed silicon on the source region 112 and the drain region 113, to form a silicide layer 120. After forming the silicide layer 120, unreacted transition metal is removed according to selective etching in which the silicide layer 120, the substrate 100 and the insulating spacer 114 are not etched. Accordingly, the silicide layers 120 remain on the exposed source/drain regions 112 and 113 and the polysilicon gate 110. However, the gate electrode pattern 110 can be formed without the salicide process.

A lower interdielectric layer 130, e.g., an oxide layer, is formed on the entire surface of the resultant structure where the silicide layer 120 is formed. An etching barrier layer is formed on the lower interdielectric layer 130 and is subsequently patterned to form a first hole and a second hole in the etching barrier layer.

The process of forming the first and second holes in the etching barrier layer will be described in detail. The etching barrier layer of 200–1000 Å is formed on the lower interdielectric layer 130. Preferably, the etching barrier layer is formed of a material having a good etching selectivity with respect to the lower interdielectric layer 130 or an upper interdielectric layer to be formed on the etching barrier layer having the first and second holes in a subsequent process. Thus, a nitride layer, an insulating layer including a nitride, or a polysilicon layer where no impurity is doped can be used. Preferably, the etching ratio of the lower interdielectric layer 130 to the etching barrier layer is 10:1 or more.

After forming a photoresist layer on the etching barrier layer, a first photoresist pattern 145P is formed through a photolithography process using a mask, to define a first contact hole to expose the drain region 113 and a second contact hole to expose the source region 112. The etching barrier layer to be patterned is formed to a thickness of 200–1000 Å, so that the thickness T1 of the photoresist layer also can be reduced. If the photoresist layer is thin, the resolution of the photolithography is increased, so that the first photoresist pattern 145P defining a small contact hole of size S1 can be formed easily. Thus, the etching barrier layer is etched using the first photoresist pattern 145P as an etching mask to form the first and second holes in the etching barrier layer, of a minimum size S1, defining the first contact hole for a bit line and the second contact hole for a storage electrode. Also, in order to define respective contact holes, e.g., a first contact hole for a bit line and a second contact hole for a storage electrode, through a discrete photolithography, respective misalignment margins should be considered. However, when the first and second contact holes are defined through one photolithography process, they are defined precisely, and the misalignment is reduced to a minimum, so that the subsequent process ensures the sufficient process margin.

Figure 3A:
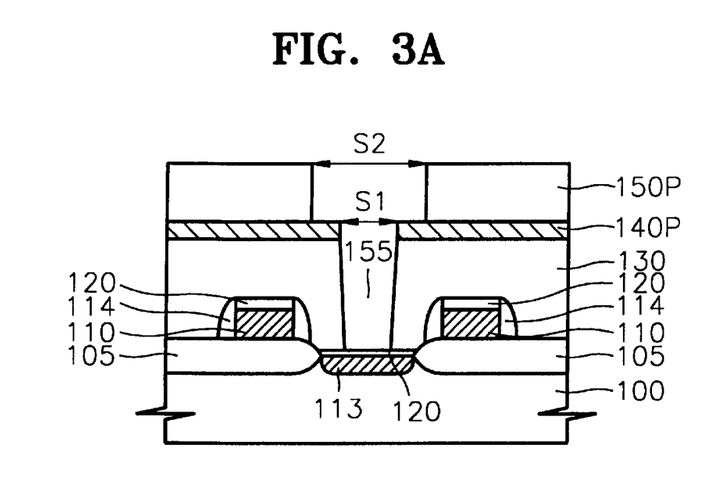
Figure 3B:
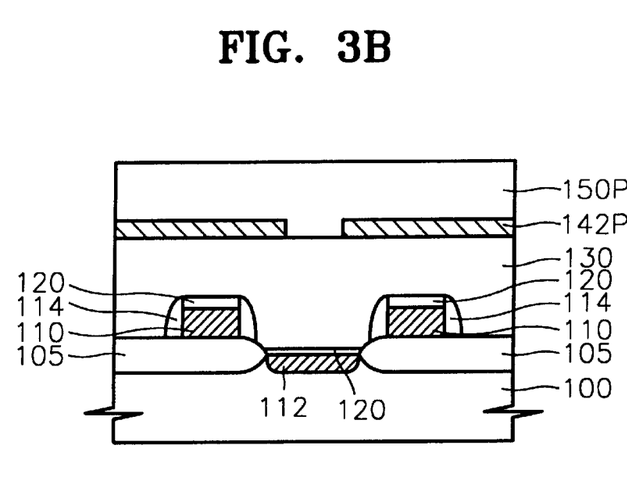

Referring to FIGS. 3A and 3B, the first photoresist pattern 145P is removed through ashing and $H_2SO_4$ stripping, and then a second photoresist pattern 150P is formed exposing the first hole in the etching barrier layer. Contact holes of the minimum size S1 are already defined by the first hole in the etching barrier layer, so that the second photoresist pattern 150P can be formed of a self-align mask, with greater area tolerance defining the size S2 of the contact hole larger than the size S1 of the first contact hole for a bit line defined by the first hole in the etching barrier layer. Thus, the process margin of the photolithography for forming the second photoresist pattern 150P is increased.

The lower interdielectric layer 130 is etched using the second photoresist pattern 150P and the first hole in the etching barrier layer as an etching mask, to form the first contact hole 155 for a bit line, exposing the drain region 113. At this time, the etching is performed under conditions in which the etching ratio of the lower interdielectric layer 130 to the etching barrier layer is 10:1 or more. Also, vertical etching is performed under conditions in which the etching ratio of the lower interdielectric layer 130 to the silicide layer 120 is 20:1 or more. If the etching ratio is less than 20:1, the thin silicide layer 120 is damaged. Thus, preferably, the etching gas is a mixture of $C_2F_6$ and $CH_3F$, or a mixture of $C_4F_8$, an inert gas and oxygen. If the mixed gas of $C_2F_6$ and $CH_3F$ is used, $C_2F_6$ at 15–40 sccm and $CH_3F$ at 0–10 sccm are flowed. Also, if the mixed gas of $C_4F_8$, an inert gas and oxygen is used, $C_4F_8$ at 10–20 sccm, the inert gas, e.g., Ar gas, at 300–600 sccm, and oxygen at 5–20 sccm, are flowed.

Since the vertical etching is performed using the first hole in the etching barrier layer defining the contact hole to the minimum size S1, the gate 110 adjacent to the drain region 113 and the silicide 120 formed on the gate 110 can be prevented from being exposed, and the first contact hole 155 of the minimum size can be formed easily. Also, etching is performed with a high etching selectivity with respect to the silicide layer 120, so that the silicide layer 120 formed on the drain region 113 is not damaged.

Figure 4A:
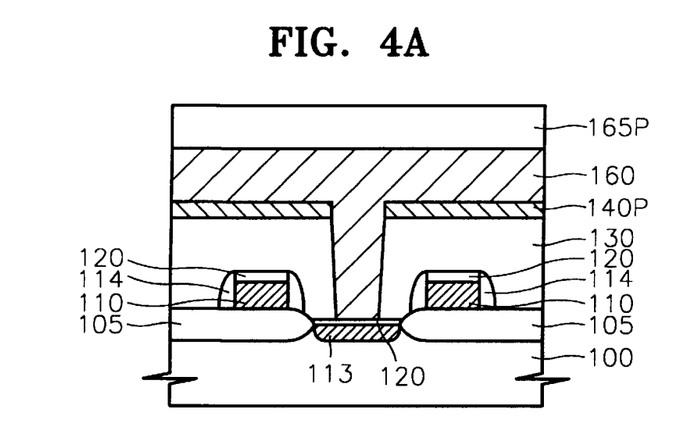
Figure 4B:
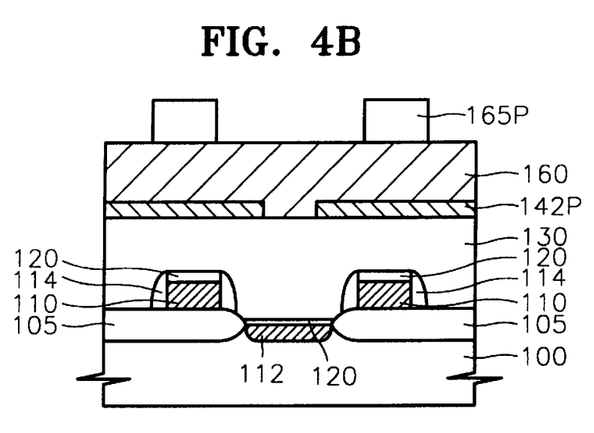

Referring to FIGS. 4A and 4B, the second photoresist pattern 150P is removed through ashing and $H_2SO_4$ stripping, a conductive layer 160 of a predetermined thickness is formed in the bit line contact hole 155 and on the etching barrier layer having the first and second holes. A third photoresist pattern 165P defining a bit line is formed on the conductive layer 160.

Figure 5A:
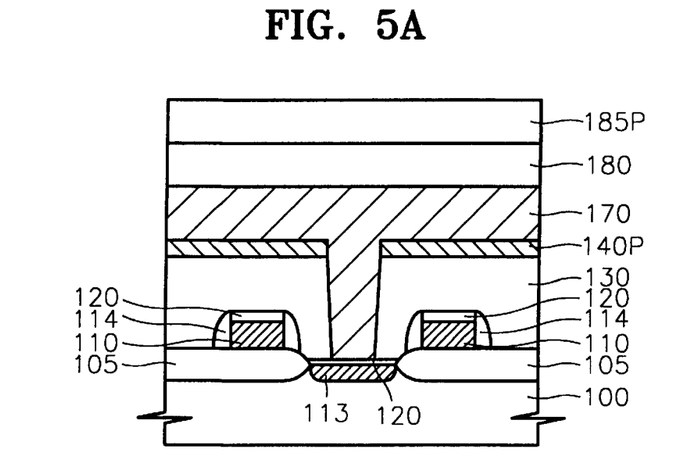
Figure 5B:
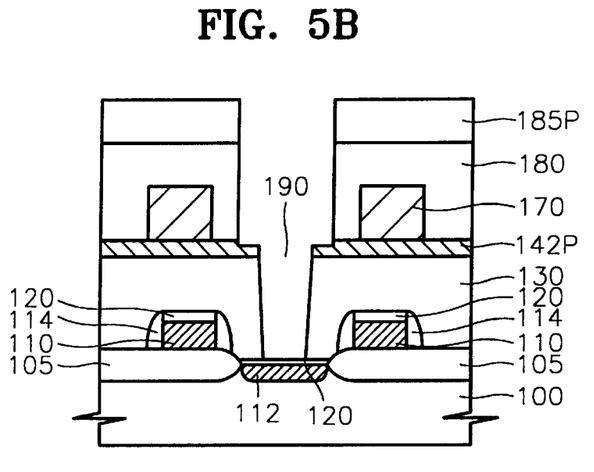

FIGS. 5A and 5B show the step of forming a fourth contact hole 190 for a storage electrode by a self-align method. The conductive layer 160 is patterned using the third photoresist pattern 165P to form a bit line 170. After removing the third photoresist pattern 165P, an upper interdielectric layer 180, is deposited on the entire surface of the resultant structure where the bit line 170 is formed. A fourth photoresist pattern 185P is formed on the upper interdielectric layer 180, to define a third contact hole exposing the second hole in the etching barrier layer defining the second contact hole for a storage electrode. As described above, the second contact hole is defined to the minimum size S1 by the second hole in the etching barrier layer, and the bit line 170 is formed under the upper interdielectric layer 180, so that the fourth photoresist pattern 185P can be formed to a self-align mask with greater area tolerance. Thus, the process margin of the photolithography can be maximized.

Subsequently, the upper interdielectric layer 180 is etched using the fourth photoresist pattern 185P as an etching mask to form a third contact hole, and the lower interdielectric layer 130 is etched using the exposed second hole in the etching barrier layer as an etching mask, to form a second contact hole exposing the source region 112. Accordingly, the second and third contact holes together make up the fourth contact hole 190 for a storage electrode.

The gas and the etching selectivity used for the etching are the same as those for forming the first contact hole 155. Thus, the fourth contact hole 190 can be formed to the minimum size, without damaging the silicide layer 120 on the source region 112 or exposing the gate electrode 110 or the silicide layer 120 on the gate electrode 110.

Figure 6A:
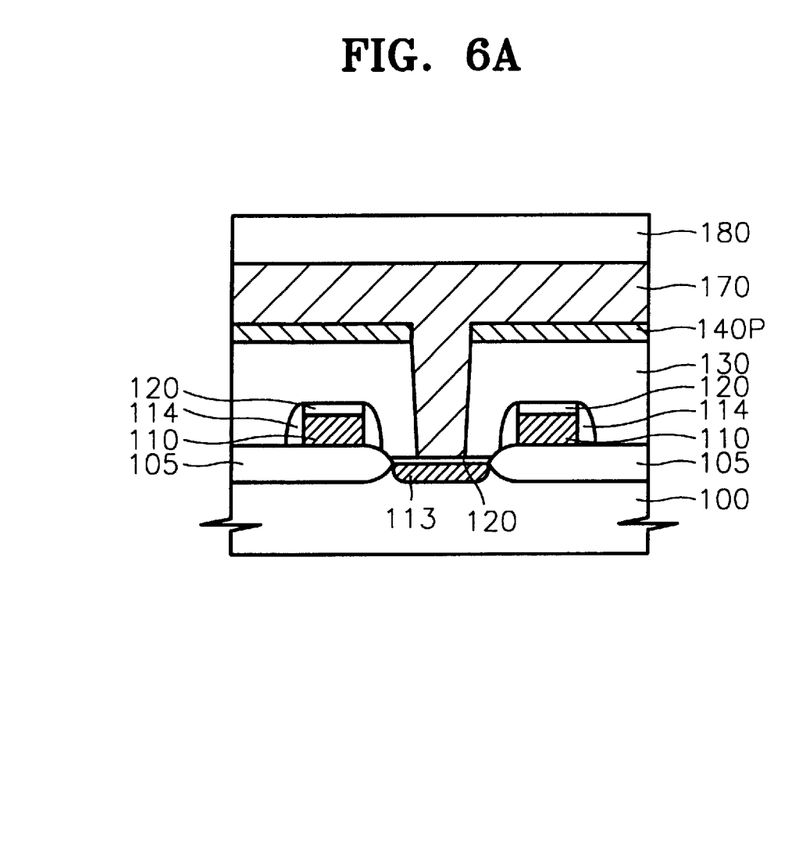
Figure 6B:
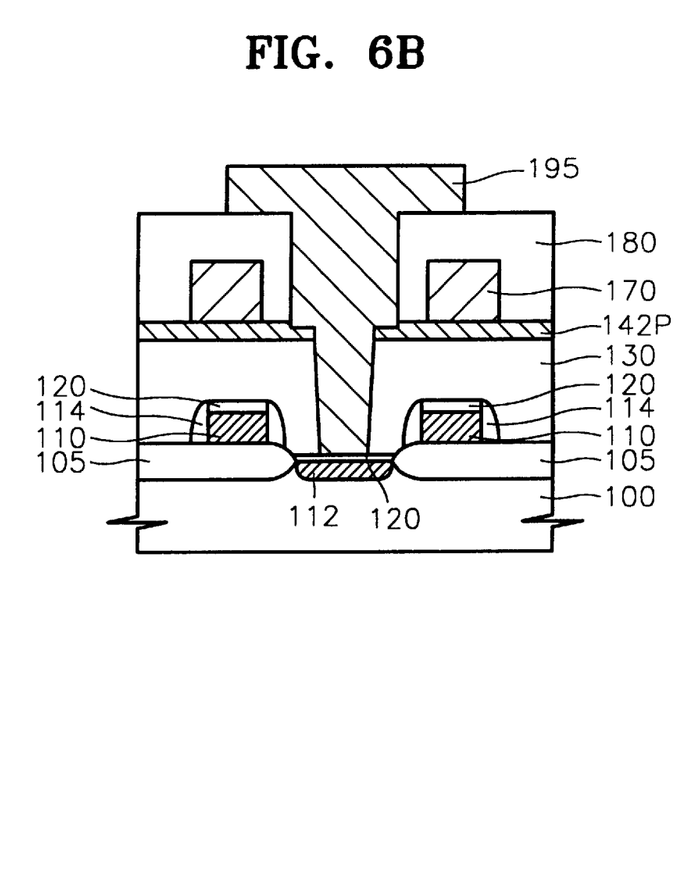

Then, as shown in FIGS. 6A and 6B, the fourth photoresist pattern 185P is removed, and then the storage electrode 195 filling the fourth contact hole 190 for a storage electrode and having a predetermined thickness on the upper interdielectric layer 180 is formed.

According to the present invention, the process of forming different contact holes of various heights are performed after pre-defining a plurality of contact holes with first and second etching barrier layer patterns formed of the same material, so that the margin of the photolithography process for defining the contact holes can be increased. Also, since the etching process has a high selectivity with respect to the etching barrier layer pattern defining the contact holes, the contact holes of the minimum size can be formed without damaging the semiconductor device characteristics.

Hereinafter, a method of forming a plurality of contact holes in accordance with the second embodiment of the present invention will be described with reference to FIGS. 7A through 12B.

In the second embodiment, the process of forming a bit line is performed using a damascene method, unlike in the first embodiment.

Figure 7A:
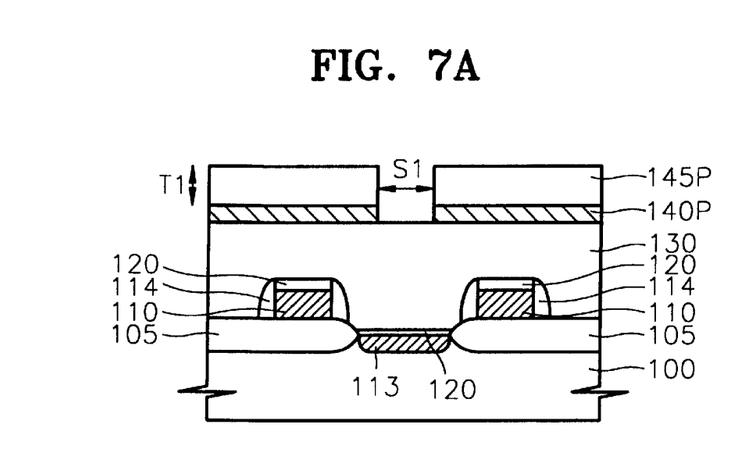
FIGS. 7A, 8A, 9A, 10A, 11A and 12A are sectional views of the DRAM device of FIG. 1 taken along line A–A', for illustrating a process of fabricating a contact hole according to another embodiment of the present invention.
Figure 7B:
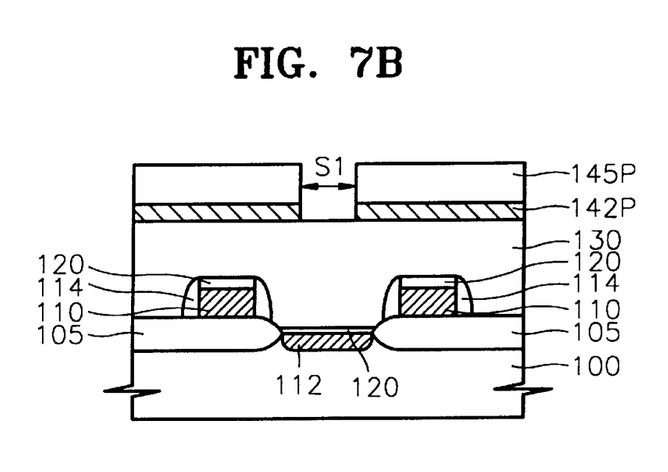

FIGS. 7A and 7B are sectional views showing a process of forming a first hole and a second hole in an etching barrier layer, which are formed in the same manner as that described in the first embodiment.

Figure 8A:
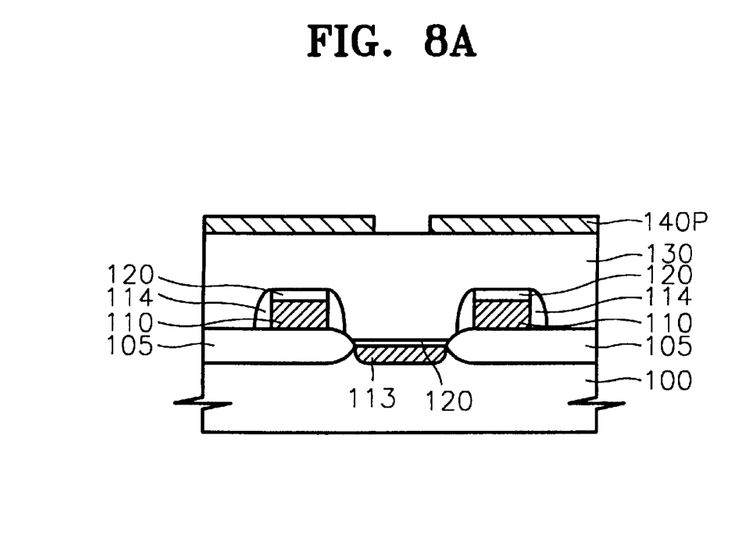
Figure 8B:
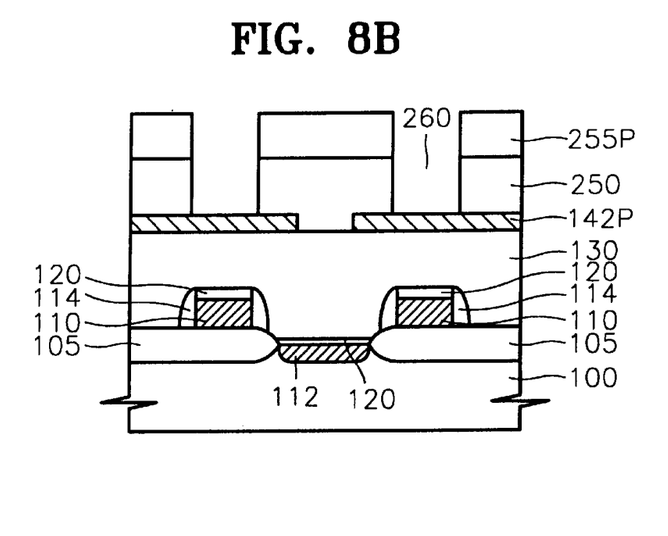

FIGS. 8A and 8B are sectional views showing the step of forming a damascene pattern 260 for forming a bit line. The first photoresist pattern 145P is removed, and then an intermediate interdielectric layer 250 is formed on the etching barrier layer. A second photoresist pattern 255P defining a bit line is formed on the intermediate interdielectric layer 250, and then the intermediate interdielectric layer 250 is etched using the second photoresist pattern 255P as an etching mask, to form the damascene pattern 260 for forming a bit line.

Figure 9A:
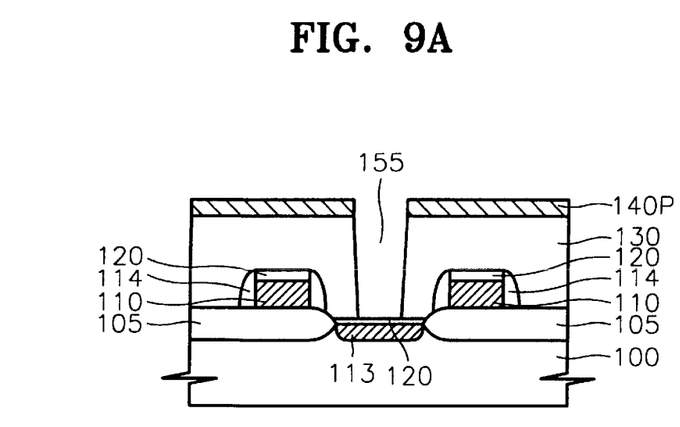
Figure 9B:
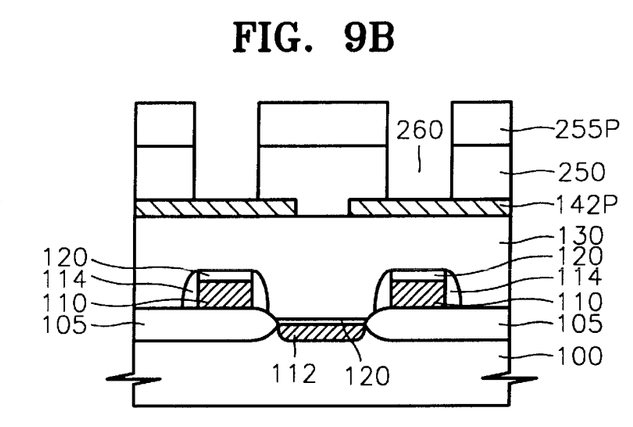

Then, as shown in FIGS. 9A and 9B, after the process of forming the damascene pattern 260, the lower interdielectric layer 130 is etched using the first hole in the etching barrier layer as an etching mask, to form a first contact hole 155 for a bit line, exposing the silicide layer 120 on the drain region 113.

As described in the first embodiment, the etching is performed under conditions in which the etching ratio of the intermediate interdielectric layer 250 and the lower interdielectric layer 130 to the etching barrier layer is 10:1 or more, and the etching ratio of the lower interdielectric layer 130 to the silicide layer is 20:1 or more, to prevent the contact from being formed on an undesired portion. Thus, the vertical etching process is performed using a mixture of $C_2F_6$ and $CH_3F$, or a mixture of $C_4F_8$, an inert gas and oxygen.

Figure 10A:
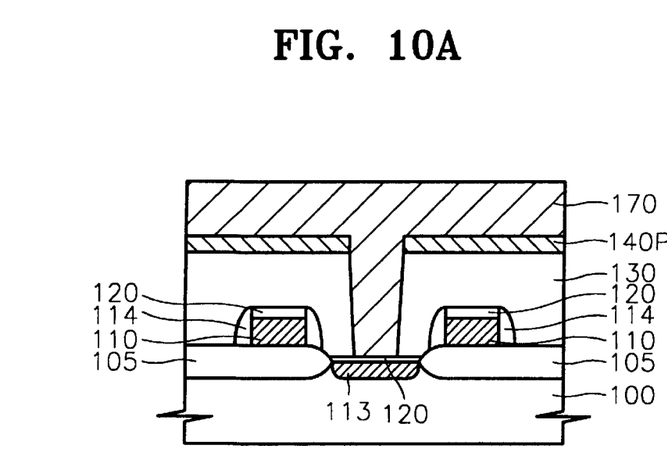
Figure 10B:
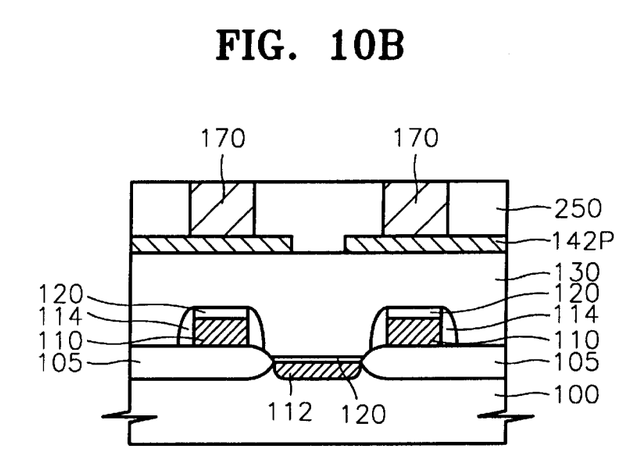
Figure 11A:
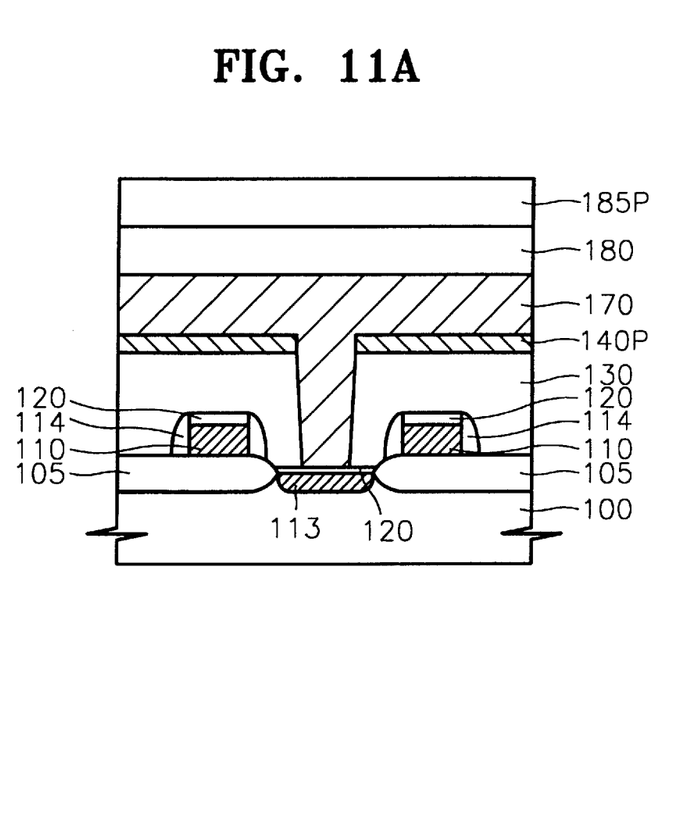
Figure 11B:
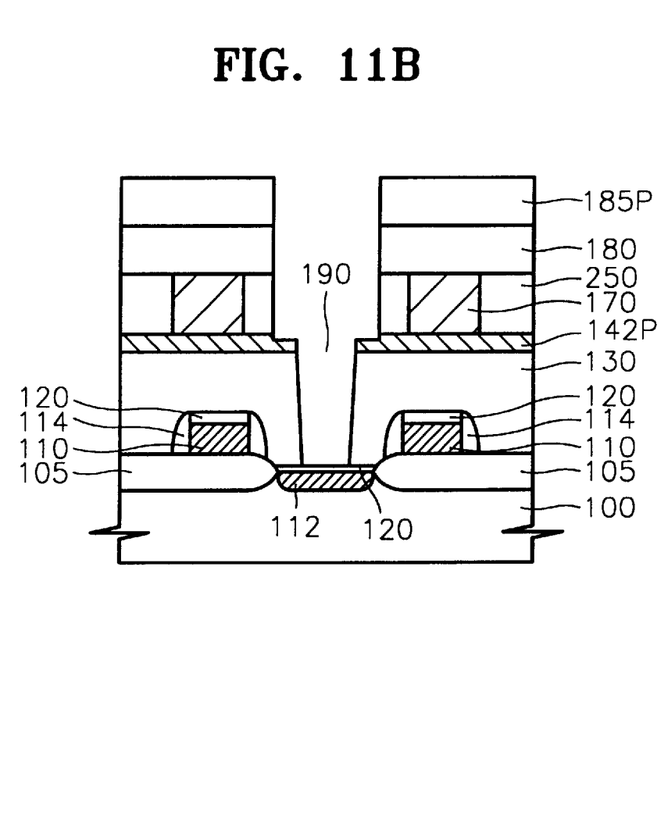
Figure 12A:
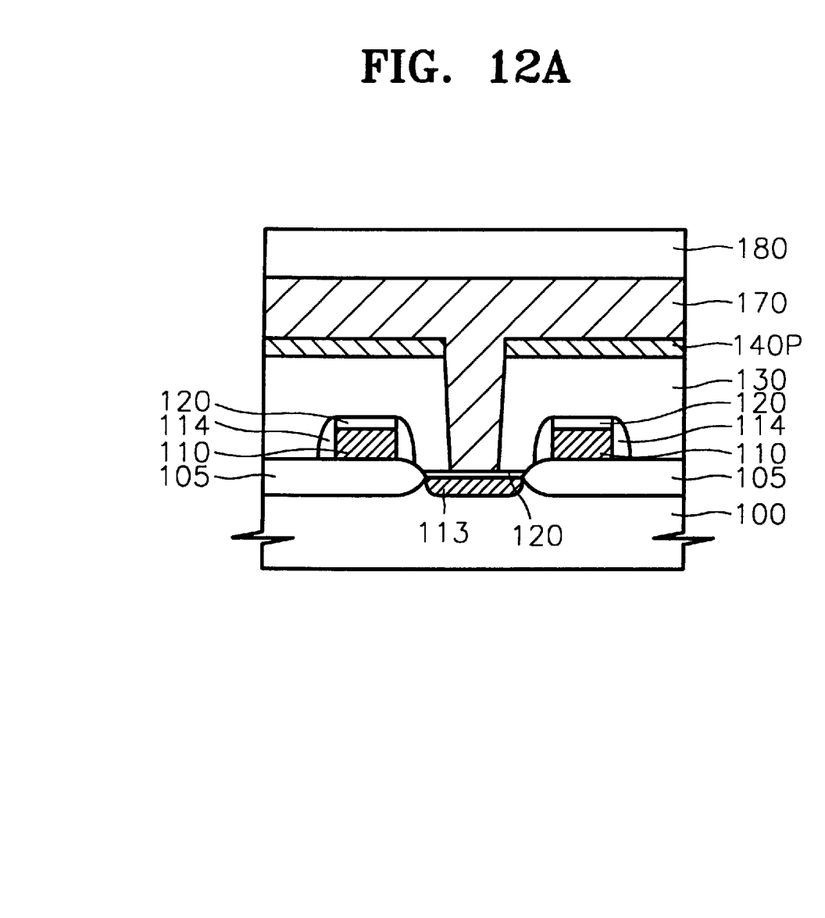
Figure 12B:
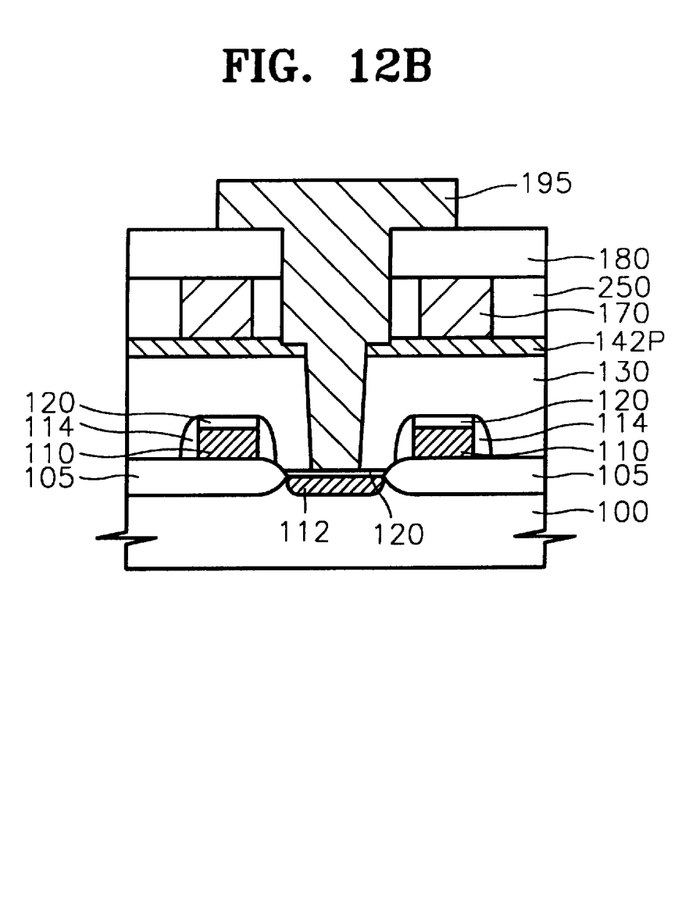

Referring to FIGS. 10A and 10B, a conductive layer is deposited to fill the damascene pattern 260 for forming a bit line and the bit line contact hole 155. Then, the conductive layer is left only in the damascene pattern 260 for forming a bit line by performing chemical mechanical polishing, to complete a bit line 170.

The fourth contact hole 190 for a storage electrode is formed and the storage electrode 195 is formed as shown in FIGS. 11A through 12B, through the same process as that in the first embodiment of FIGS. 5A through 6B, except that the upper interdielectric layer 180 is formed on the intermediate interdielectric layer 250.

The above first and second embodiments described a process of forming a capacitor-over-bit line structure, but can also be adapted to form a structure in which the storage electrode of the capacitor is formed under the bit line. Also, the above embodiments can be adapted to form other contact holes instead of the bit line contact hole and the storage electrode contact hole.

According to the present invention, an etching barrier layer pattern is used to form a plurality of contact holes to the minimum size. The etching barrier layer is formed of a material having a high etching selectivity with respect to a layer to be etched away, and then can be a thin film. Thus, the photoresist layer for forming the etching barrier layer pattern can also be thin, to thereby increase the resolution of the photolithography process. As a result, the photoresist pattern can be formed at the maximum resolution, so that the etching barrier layer pattern can be also formed accurately to define minimum size contact holes. Thus, if the etching barrier layer pattern according to the present invention is used, the contact hole of the minimum size can be formed.

Also, misalignment is reduced to a minimum since a plurality of various contact holes are precisely defined by a single photolithography process step, to thereby ensure a sufficient process margin in a subsequent process. Thus, the photolithography process for defining each of the contact holes in the subsequent process can be performed using a self-align mask with greater area tolerance.

Also, the vertical etching process is performed using an etching barrier layer pattern defining the contact hole to the minimum size, to thereby prevent the gate adjacent to the conductive region exposed by the contact hole and the silicide formed on the gate from being exposed by the contact hole. Also, the etching is performed with a high etching selectivity with respect to the silicide layer, so that the silicide formed on the conductive region is not damaged, thereby enhancing the characteristics of the semiconductor device.

What is claimed is:

1. A method for fabricating contact holes in a semiconductor device, comprising the steps of:
    (a) providing a semiconductor substrate where first and second conductive regions are formed;
    (b) forming a lower interdielectric layer on the semiconductor substrate;
    (c) forming an etching barrier layer on the lower interdielectric layer;
    (d) forming a first hole and a second hole in the etching barrier layer, said first hole overlying the first conductive region, said second hole overlying the second conductive region;
    (e) etching the lower interdielectric layer, using the first hole as an etching mask, thereby forming a first contact hole exposing the first conductive region;
    (f) forming a conductive line overlying the etching barrier layer and filling the first contact hole;
    (g) forming an upper interdielectric layer on the conductive line;
    (h) forming a mask pattern on the upper interdielectric layer, said mask pattern defining a third contact hole overlying the second hole; and
    (i) etching the upper interdielectric layer, using the mask pattern as an etching mask, thereby forming the third contact hole, and etching the lower interdielectric layer, using the second hole as an etching mask, thereby forming a second contact hole exposing the second conductive region.

2. The method of claim 1, wherein in the steps (e) and (i) of etching, the etching ratio of the lower and upper interdielectric layers to the etching barrier layer is 10:1 or more.

3. The method of claim 2, wherein the etching barrier layer is selected from the group consisting of a nitride layer, an insulating layer including a nitride, and an undoped polysilicon layer.

4. The method of claim 2, wherein the etching barrier layer is formed to a thickness of 200–1000 Å.

5. The method of claim 2, wherein the steps (e) and (i) of etching are performed using a gas mixture of $C_2F_6$ and $CH_3F$, or a gas mixture of $C_4F_8$, an inert gas and oxygen.

6. The method of claim 1, further comprising, before the step (e), the step of forming a first contact hole mask pat verifying the first hole in the etching barrier layer, wherein the first contact hole mask pattern and the first hole in the etching barrier layer are used as an etching mask during the step (e).

7. The method of claim 1, further comprising the step of forming a silicide layer on the first and second conductive regions and a region adjacent to the first and second conductive regions, before the step (b).

8. A method for fabricating contact holes in a semiconductor device, comprising the steps of:
    (a) providing a semiconductor substrate where first and second conductive regions are formed;
    (b) forming a lower interdielectric layer on the semiconductor substrate;
    (c) forming an etching barrier layer on the lower interdielectric layer;
    (d) forming a first hole and a second hole in the etching barrier layer, said first hole overlying the first conductive region, and said second hole overlying the second conductive region;
    (e) forming an intermediate interdielectric layer on the etching barrier layer;
    (f) forming a damascene pattern in the intermediate interdielectric layer for forming a conductive line;
    (g) etching the lower interdielectric layer, using the first hole in the etching barrier layer as an etching mask, thereby forming a first contact hole exposing the first conductive region;
    (h) forming a conductive line overlying the etching barrier layer and filling the first contact hole and the damascene pattern;
    (i) forming an upper interdielectric layer overlying the conductive line;
    (j) forming a mask pattern on the upper interdielectric layer, said mask pattern defining a third contact hole overlying the second hole in the etching barrier layer; and
    (k) etching the upper and intermediate interdielectric layers, using the mask pattern as an etching mask, thereby forming the third contact hole, and etching the lower interdielectric layer, using the second hole as an etching mask, thereby forming a second contact hole exposing the second conductive region.

9. The method of claim 8, wherein in the steps (g) and (k) of etching, the etching ratio of the lower and upper interdielectric layers to the etching barrier layer is 10:1 or more.

10. The method of claim 9, wherein the etching barrier layer is selected from the group consisting of a nitride layer, an insulating layer including a nitride, and an undoped polysilicon layer.

11. The method of claim 9, wherein the etching barrier layer is formed to a thickness of 200–1000 Å.

12. The method of claim 8, wherein the steps (g) and (k) of etching are performed using a gas mixture of $C_2F_6$ and $CH_3F$ and a gas mixture of $C_4F_8$, an inert gas and oxygen.

13. The method of claim 8, further comprising, before the step (f), the step of forming a conductive line mask pattern on the intermediate interdielectric layer, said conductive line mask pattern defining the damascene pattern, wherein in the step (g), the conductive line mask pattern and the first hole in the etching barrier layer are used as an etching mask.

14. The method of claim 8, further comprising the step of forming a sulicide layer on the first and the second conductive regions and in a region adjacent to the first and the second conductive regions.

* * * * *

UNITED STATES PATENT AND TRADEMARK OFFICE
CERTIFICATE OF CORRECTION

PATENT NO. : 6,150,281
DATED : November 21, 2000
INVENTOR(S) : Sung-un Kwean

It is certified that error appears in the above-identified patent and that said Letters Patent is hereby corrected as shown below:

Column 1,
Line 66, "lowering the is uniformity" should read -- lowering the uniformity --

Column 2,
Line 66, "C3F" should read -- CH3F --

Column 3,
Line 29, "103B" should read -- 10B --
Line 31, "B-B-" should read -- B-B' --

Column 8,
Line 17, "pat" should read -- pattern --
Line 18, "verifying" should read -- overlying --

Column 9,
Line 7, "CH3F" should read -- CH3F7 --

Column 10,
Line 6, "sulicide" should read -- silicide --

Signed and Sealed this

Twenty-first Day of May, 2002

Attest:

Attesting Officer

JAMES E. ROGAN
Director of the United States Patent and Trademark Office